United States Patent
Kimura

[11] Patent Number: 5,874,752
[45] Date of Patent: Feb. 23, 1999

[54] LIGHT DETECTING DEVICE

[75] Inventor: Tatsuya Kimura, Tokyo, Japan

[73] Assignee: Mitsubishi Denki Kabushiki Kaisha, Tokyo, Japan

[21] Appl. No.: 947,146

[22] Filed: Oct. 8, 1997

[30] Foreign Application Priority Data

May 26, 1997 [JP] Japan ..................................... 9-135161

[51] Int. Cl.⁶ .............................................. H01L 31/0328
[52] U.S. Cl. .......................... 257/186; 257/184; 257/436; 257/438
[58] Field of Search ..................................... 257/184, 186, 257/190, 199, 436, 435, 438, 452

[56] References Cited

U.S. PATENT DOCUMENTS 4,840,916  6/1989  Yasuda et al. ........................ 257/186

FOREIGN PATENT DOCUMENTS 391280  4/1991  Japan .

*Primary Examiner*—Minh Loan Tran
*Attorney, Agent, or Firm*—Leydig, Voit & Mayer

[57] ABSTRACT

A light detecting device includes a first conductivity type semiconductor substrate; an insulating semiconductor window layer disposed on the substrate; a concavity in a region of the window layer and penetrating through the window layer; successively disposed in the concavity, a first conductivity type lower cladding layer, a first conductivity type guide layer of a semiconductor material having a band gap energy smaller that the band gap energies of the lower cladding layer and the window layer, an undoped light absorption layer having a band gap energy smaller than that of the first conductivity type guide layer, and a second conductivity type guide layer having a composition approximately identical to that of the first conductivity type guide layer, edges of the first conductivity type guide layer, the light absorption layer, and the second conductivity type guide layer being exposed at a surface of the window layer; and a layer of an insulating material, covering the edges. The interface between the window layer and the lower cladding layer is a regrowth interface and does not contact the absorption layer. The light detecting device has reduced dark current.

5 Claims, 11 Drawing Sheets

[1$\bar{1}$0] direction

[110] direction

LIGHT DETECTING DEVICE

FIELD OF THE INVENTION

The present invention relates to a waveguide type light detecting device.

BACKGROUND OF THE INVENTION

FIGS. 11(a) to 11(c) are cross-sectional views illustrating process steps in a conventional method for fabricating a waveguide type photodiode.

In these figures, reference numeral 1 designates an n type (hereinafter referred to as "n-") InP substrate (wafer) having a surface orientation of (001). An n-InP lower cladding layer 5 having a thickness of 0.5 μm and a carrier concentration of $1\times10^{18}cm^{-3}$ is disposed on the substrate 1. An n-InGaAsP guide layer 6 having a thickness of 0.8 μm and a carrier concentration of $1\times10^{18}cm^{-3}$ is disposed on the lower cladding layer 5, and its composition ratio is 1.4 μm. An undoped InGaAs absorption layer 7 having a thickness of 0.6 μm is disposed on the guide layer 6. A p type (hereinafter referred to as "p-") InGaAsP guide layer 8 having a thickness of 0.8 μm, a carrier concentration of $1\times10^{18}cm^{-3}$, and an optical absorption wavelength of 1.4 μm is disposed on the absorption layer 7. A p-InP upper cladding layer 25 having a thickness of 2 μm and a carrier concentration of $1\times10^{18}cm^{-3}$ is disposed on the guide layer 8. A p-InGaAs contact layer 10a having a thickness of 0.25 μm and a carrier concentration of $1\times10^{19}cm^{-3}$ is disposed on the upper cladding layer 25. Reference numeral 40 designates a mask for selective growth, comprising an insulating film of, for example, $SiO_2$ (hereinafter referred to as a selective growth mask). Reference numeral 3 designates an Fe (iron) doped InP window layer having a thickness of 4 μm and a dopant (Fe) concentration of $4\times10^{16}cm^{-3}$.

FIG. 12 is a plan view, showing a main step of the fabrication method. In FIG. 12, the same reference numerals as those shown in FIGS. 11(a)–11(c) designate the same or corresponding parts. The cross-sectional views of FIGS. 11(a)–11(c) are taken along a line 11—11 of FIG. 12.

A description is given of the method of fabricating the conventional photodiode. Initially, as shown in FIG. 11(a), the n-InP cladding layer 5, the n-InGaAsP guide layer 6, the InGaAs absorption layer 7, the p-InGaAsP guide layer 8, the p-InP layer 25, and the p-InGaAs contact layer 10a are successively grown on the (001) surface of the n-InP substrate (wafer) 1 by MOCVD (Metal Organic Chemical Vapor Deposition).

Next, as shown in FIG. 11(b), over the entire surface of the grown semiconductor layers, an $SiO_2$ film (not shown) is deposited by sputtering and patterned by photolithography, forming an $SiO_2$ selective growth mask 40. The mask shape viewed from the top of the structure is, as shown in FIG. 12, a rectangular area having a width of 10 μm and a length of 20 μm. Using the selective growth mask 40 as a mask for etching, the grown semiconductor layers are etched to a depth of 4.5 μm using a bromine based etchant. Since this etching is isotropic, each semiconductor layer is subjected to side-etching. As a result of the side etching, the area of the InGaAs absorption layer 7, viewed from the top of the structure, becomes approximately 4×14 μm².

Thereafter, as shown in FIG. 11(c), using the selective growth mask 40, the Fe-doped InP window layer 3 is selectively grown on the side surfaces of the structure formed by the above-mentioned etching, using MOCVD, followed by removal of the $SiO_2$ selective growth mask 40.

Thereafter, a p side electrode and an n side electrode (not shown) are formed on the surface of the contact layer 10a and the rear surface of the substrate 1, respectively, completing a photodiode.

The operating principle of the photodiode so fabricated will be described. Light incident on a facet of the photodiode perpendicular to the surface of the substrate 1 enters the InGaAs absorption layer 7 through the Fe-doped InP window layer 3, and the light is absorbed in the layer 7. Electrons and holes generated by the optical absorption in the layer 7 are immediately swept by an electric field that is generated by a reverse bias applied to the photodiode, and are taken out as light signals. By decreasing the thickness of the InGaAs absorption layer 7, it is possible to make the photodiode correspond to high frequencies of 40 GHz or more. The InGaAsP guide layers 6 and 8, disposed across the InGaAs absorption layer 7, confine the incident light in a region near the edge of the absorption layer 7 by reflecting the light in the direction perpendicular to the substrate 1, so that the incident light is efficiently transmitted deep into the device, thereby improving the light absorption efficiency.

In a photodiode as shown in FIG. 11(a), where the layers 5 to 10a are simply grown on the substrate 1, a pn junction between the guide layers 6 and 8, through the light absorption layer 7, is exposed at a facet of the device. In this photodiode, since the absorption layer 7 is exposed at the facet, many surface states are generated in a portion of the absorption layer 7 in the vicinity of the facet, and incident light is absorbed by these surface states during the operation of the photodiode. As a result, dark current increases, and a portion in which light is absorbed generates heat. After many hours, dislocations occur due to that portion, resulting in optical deterioration of the photodiode. In addition, since the facet of the photodiode is exposed, the edge of the absorption layer 7 is adversely affected by exterior environments, such as oxidation, leading to deterioration. Consequently, it is impossible to provide a photodiode excellent in reliability.

In order to solve the above-mentioned problem, in the conventional photodiode, as shown in FIG. 11(c), the window layer 3 having a band gap energy larger than that of the guide layers 6 and 8 is formed at the facet so that the light responsive part of the photodiode has a window structure. Since the window structure prevents the edge of the absorption layer 7 from being exposed, surface states are reduced, avoiding optical deterioration of the photodiode and deterioration of the absorption layer 7 due to exterior environments. The reason why the window layer 3 is doped with iron is to increase the resistance of the window layer 3 for preventing current leakage. In place of iron, a transition metal, such as cobalt, vanadium, or titanium, may be used. Alternatively, instead of doping with iron, an undoped window layer having a high resistance may be formed.

However, the conventional method of fabricating a light detecting device, such as a photodiode mentioned above, has the following drawbacks. Since the window layer is formed by etching portions of semiconductor layers successively grown on the substrate and then regrowing the window layer in a region produced by the etching, an interface of the grown semiconductor layers and the regrown window layer (hereinafter referred to as a regrowth interface) is exposed, and new surface states are produced on the regrowth interface because the regrowth interface is exposed and contaminated. When surface states are present on a portion of the absorption layer, a depletion region, adjacent to the regrowth interface, light is absorbed by the surface states and dark current is generated during operation. For example, dark current increases by approximately 200 nA. Such dark current usually increases in proportion to the area of the regrowth interface.

SUMMARY OF THE INVENTION

It is an object of the present invention to provide a light detecting device with reduced dark current.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a light detecting device comprises a first conductivity type semiconductor substrate; a window layer disposed on the substrate and comprising an insulating semiconductor layer having a thickness and a band gap energy; a concave formed in a prescribed region of the window layer and having a depth larger than the thickness of the window layer; a first conductivity type lower cladding layer comprising a semiconductor material having a band gap energy, a first conductivity type guide layer comprising a semiconductor material having a composition and a band gap energy smaller than those of the lower cladding layer and the window layer, an undoped light absorption layer comprising a semiconductor material having a band gap energy smaller than that of the first conductivity type guide layer, and a second conductivity type guide layer comprising a semiconductor material having a composition approximately equal to that of the first conductivity type guide layer, all of these layers being successively grown on bottom and side surfaces of the concave of the window layer, and edges of the first conductivity type guide layer, the light absorption layer, and the second conductivity type guide layer being exposed at the surface; and a layer of an insulating material, disposed covering the edges. In this structure, an interface between the window layer and the lower cladding layer corresponds to a regrowth interface. This prevents the regrowth interface from being in contact with the light absorption layer, resulting in a light detecting device with reduced dark current.

According to a second aspect of the present invention, in the above-mentioned light detecting device, the layer of an insulating material is an insulating semiconductor layer. Therefore, it is possible to improve adhesion between an edge of a pn junction and the insulating layer, resulting in a light detecting device with improved characteristics and reliability.

According to a third aspect of the present invention, a light detecting device comprises a first conductivity type semiconductor substrate; a first conductivity type guide layer comprising a semiconductor material having a composition and a band gap energy, an undoped light absorption layer comprising a semiconductor material having a band gap energy smaller than that of the first conductivity type guide layer, and a second conductivity type guide layer comprising a semiconductor material having a composition approximately equal to that of the first conductivity type guide layer, and these layers being successively disposed on a prescribed area of the substrate and having edges that slope toward the substrate; a window layer comprising a semiconductor layer being insulated by doping a transition metal and having a band gap energy larger than that of the first conductivity type guide layer, disposed on the surface of the second conductivity type guide layer and on the sloped edges of the second conductivity type guide layer, the light absorption layer, and the first conductivity type guide layer; and a region containing a dopant impurity producing the second conductivity type, disposed in a region of the window layer opposite the second conductivity type guide layer. Since no regrowth interface is present in this light detecting device, dark current is reduced.

According to a fourth aspect of the present invention, the above-mentioned light detecting device further comprises a protection layer comprising the same material as the window layer and being insulated by doping a transition metal, disposed on the window layer and on a region of the substrate where the semiconductor layers are not present, the protection layer having a facet perpendicular to the planar surface of the light absorption layer; and a region containing a dopant impurity producing the second conductivity type, disposed in a region of the protection layer opposite the second conductivity type guide layer. Therefore, incident light is prevented from being reflected at the facet, resulting in a light detecting device with an excellent optical coupling efficiency.

According to a fifth aspect of the present invention, a light detecting device comprises a first conductivity type semiconductor substrate having an upper stage, and a step at an edge of the upper stage; a first conductivity type guide layer comprising a semiconductor material having a composition and a band gap energy, an undoped light absorption layer comprising a semiconductor material having a band gap energy smaller than that of the first conductivity type guide layer, and a second conductivity type guide layer comprising a semiconductor material having a composition approximately equal to that of the first conductivity type guide layer, and these layers being successively grown on the upper stage of the substrate and having edges sloping toward the substrate in the vicinity of the edge of the upper stage; a window layer comprising a semiconductor layer being insulated by doping a transition metal and having a band gap energy larger than that of the first conductivity type guide layer, the window layer being grown subsequently to the second conductivity type guide layer on the surface of the second conductivity type guide layer and on the sloped edges of the second conductivity type guide layer, the light absorption layer, and the first conductivity type guide layer; and a region containing a dopant impurity producing the second conductivity type, disposed in a region of the window layer opposite the second conductivity type guide layer. Since this light detecting device has no regrowth interface, dark current is reduced.

DETAILED DESCRIPTION OF THE PREFERRED EMBODIMENTS

[Embodiment 1]

Figure 1:
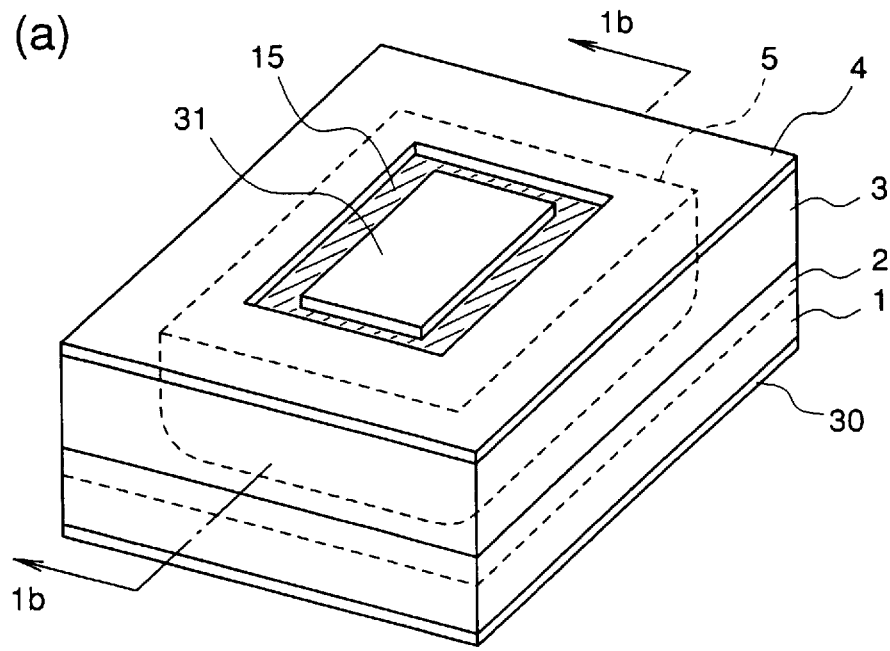
FIGS. 1(a) and 1(b) are diagrams showing a structure of a light detecting device according to a first embodiment of the invention.
Figure 1:
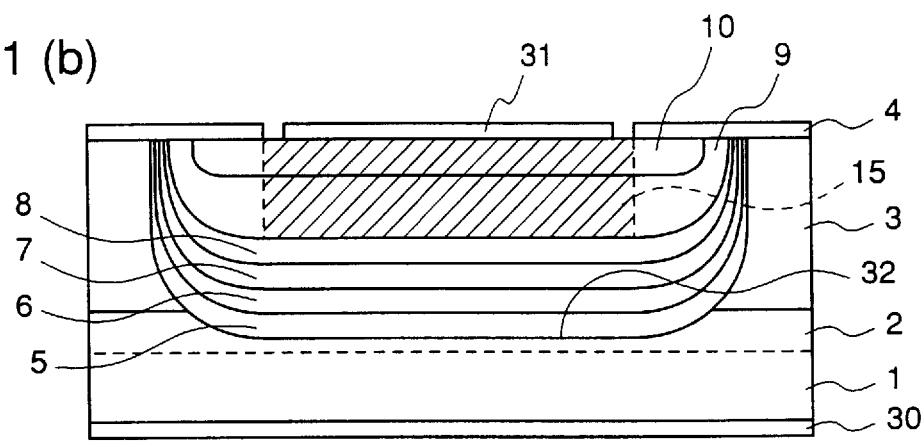

FIG. 1(a) is a perspective view showing a structure of a photodiode according to a first embodiment of the present invention, and FIG. 1(b) is a cross-sectional view taken along a line 1b—1b of FIG. 1(a). As shown in the figures, the photodiode includes an n-InP substrate (wafer) 1 having a surface orientation of (001). An n-InP buffer layer 2 having a thickness of 0.5 $\mu$m and a carrier concentration of $1 \times 10^{18} cm^{-3}$ is disposed on the n-InP substrate 1.

An Fe-doped InP window layer 3 having a thickness of 4 $\mu$m and a dopant (Fe) concentration of $4 \times 10^{16} cm^{-3}$ is disposed on the buffer layer 2. In place of iron, a transition metal, such as cobalt, vanadium, or titanium, may be used. Alternatively, instead of doping iron, an undoped InP layer may be used. Any material may be employed as a semiconductor material of the window layer 3 as long as it has a band gap energy larger than that of a guide layer described later. Further, the window layer 3 has a concavity 32 in a prescribed region, reaching into the buffer layer 2.

On the bottom and side surfaces of the concavity of the window layer 3, there are successively disposed an n-InP lower cladding layer 5, an n-InGaAsP guide layer 6, an undoped InGaAs absorption layer 7, a p-InGaAsP guide layer 8, an Fe-doped InP upper cladding layer 9, and an undoped InGaAs contact layer 10. The n-InP lower cladding layer 5 has a thickness of 0.5 $\mu$m and a carrier concentration of $1 \times 10^{18} cm^{-3}$. The n-InGaAsP guide layer 6 has a thickness of 0.8 $\mu$m and a carrier concentration of $1 \times 10^{18} cm^{-3}$, and its composition ratio is adjusted so as to have an optical absorption wavelength of 1.4 $\mu$m band. The undoped InGaAs absorption layer 7 has a thickness of 0.6 $\mu$m. The p-InGaAsP guide layer 8 has a thickness of 0.8 $\mu$m, a carrier concentration of $1 \times 10^{18} cm^{-3}$, and a light absorption wavelength of 1.4 $\mu$m. The Fe-doped InP upper cladding layer 9 has a thickness of 2 $\mu$m and a dopant concentration of $4 \times 10^{16} cm^{-3}$. The undoped InGaAs contact layer 10 has a thickness of 0.25 $\mu$m.

A selective growth mask 4 comprising an insulating film, such as an $SiO_2$ film, is disposed on the surface of the structure, masking edges of the guide layer 6, absorption layer 7, guide layer 8, upper cladding layer 9, and contact layer 10 exposed at the surface. The selective growth mask 4 has a rectangular opening, and the longitudinal direction of the opening is along a [110] direction while the direction perpendicular to the longitudinal direction is [110].

Furthermore, a Zn-diffused region 15 is located in the center of the structure. In place of Zn, other dopant impurities producing p type conductivity may be employed.

A method of fabricating the photodiode so constructed will be described using FIGS. 2(a) to 2(d) and FIG. 3.

FIGS. 2(a) to 2(d) are cross-sectional views taken along a line 1b—1b of FIG. 1, and show process steps in the fabrication of the photodiode. In these figures, the same reference numerals as in FIG. 1 designate the same or corresponding parts.

Figure 2:
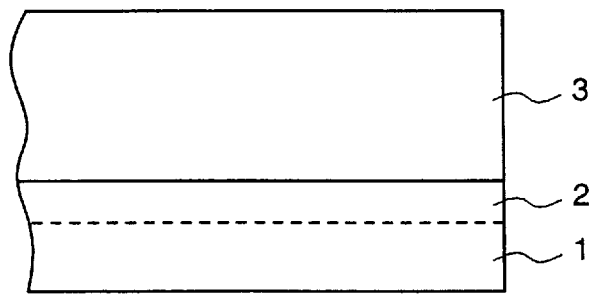
FIG. 2(a) to 2(d) are cross-sectional views showing process steps in a method of fabricating a light detecting device according to the first embodiment.
Figure 2:
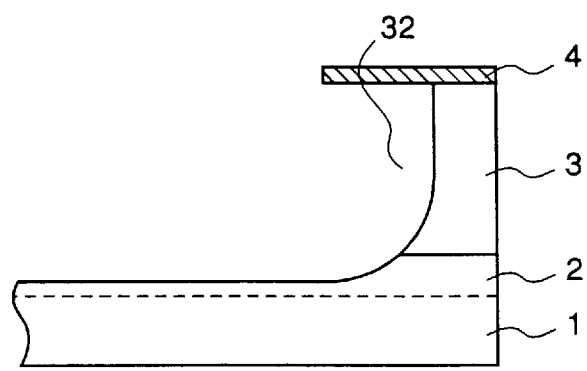
Figure 2:
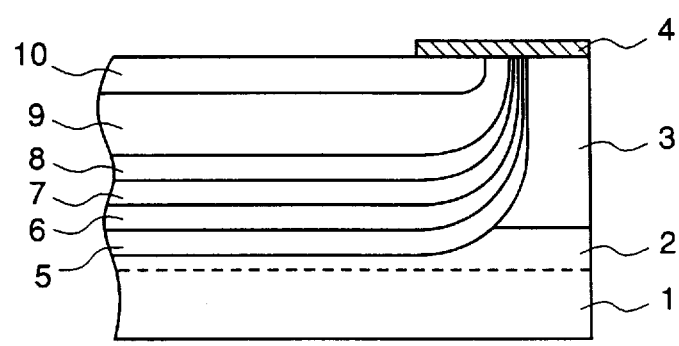
Figure 2:
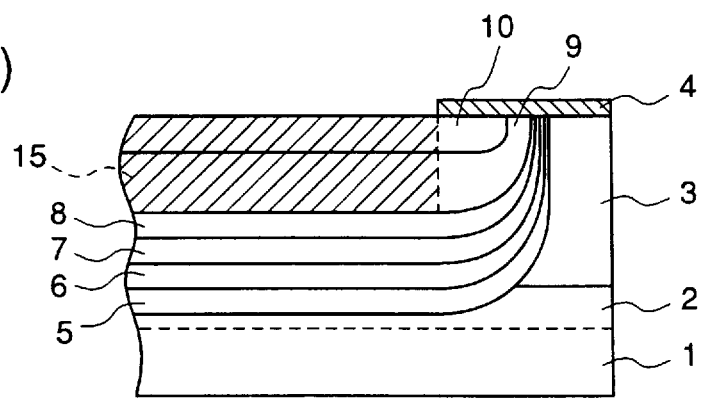
Figure 3:
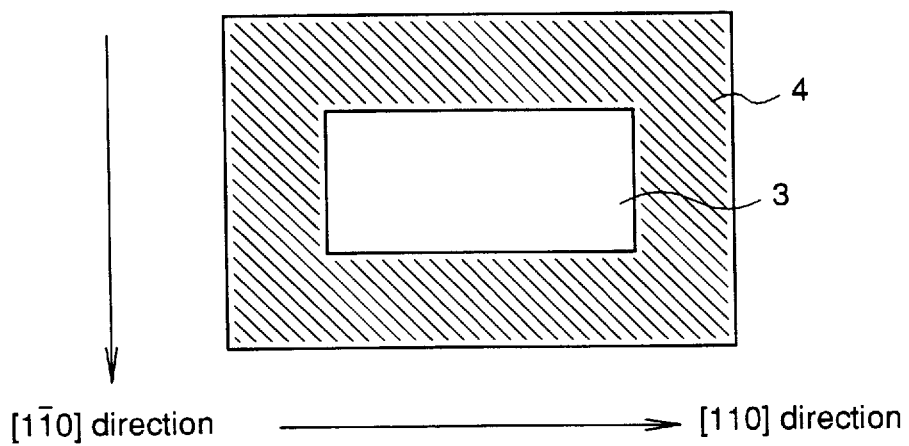
FIG. 3 is a diagram showing a main step of the fabrication method according to the first embodiment.

FIG. 3 is a plan view, showing a main step of the fabrication method. In FIG. 3, the same reference numerals as in FIGS. 2(a) to 2(d) designate the same or corresponding parts.

Initially, as shown in FIG. 2(a), the n-InP buffer layer 2 and the Fe-doped InP window layer 3 are successively grown on the n-InP substrate 1 by MOCVD. Then, over the entire surface of the Fe-doped InP window layer 3, an $SiO_2$ film is deposited by sputtering and patterned by photolithography and selective etching, thereby forming an $SiO_2$ selective growth mask 4 having a rectangular opening 5 $\mu$m wide and 15 $\mu$m long, as shown in FIG. 3.

As shown in FIG. 2(b), using the selective growth mask 4 as a mask for etching, the Fe-doped InP window layer 3 is etched from its surface until the etching front reaches into the buffer layer 2, for example, 4.5 $\mu$m deep, using a bromine based etchant, to form a concavity 32. Since this etching is isotropic, each semiconductor layer is subjected to side-etching, so that side surfaces of the concavity 32 are located beneath the selective growth mask 4.

Next, as shown in FIG. 2(c), using the selective growth mask 4, the n-InP lower cladding layer 5, the n-InGaAsP guide layer 6, the InGaAs absorption layer 7, the p-InGaAsP guide layer 8, the Fe-doped InP upper cladding layer 9, and the InGaAs contact layer 10 are successively grown on the bottom and side surfaces of the concavity 32 by MOCVD. The aforementioned thickness of each semiconductor layer grown in the concavity 32 is a thickness of a portion of the semiconductor layer on a flat surface, i.e., the bottom of the concavity 32. Since the growth rate of each semiconductor layer is lower on the side surfaces of the concavity 32 perpendicular to the surface of the substrate 1 than on the bottom of the concavity 32 parallel to the surface of the substrate 1, the thickness of the semiconductor layer grown on the side surfaces of the concavity 32 decreases in approaching closer to the $SiO_2$ selective growth mask.

Thereafter, as shown in FIG. 2(d), Zn is diffused through the opening of the selective growth mask 4 so that Zn reaches an interface between the Fe-doped InP upper cladding layer 9 and the p-InGaAsP guide layer 8, to form a p type Zn diffused region 15. Instead of diffusing an acceptor impurity (Zn in this case) into the high-resistance upper cladding layer 9 and the contact layer 10 to make these layers p type, an upper cladding layer and a contact layer which have been doped with an acceptor impurity may be grown.

Finally, an n side electrode 30 is formed on the rear surface of the substrate 1, and a p side electrode 31 is formed in ohmic contact with the contact layer 10, completing the photodiode shown in FIGS. 1(a) and 1(b).

The operating principle of the photodiode will be described. Light incident on a facet of the photodiode perpendicular to the surface of the substrate 1 enters the InGaAs absorption layer 7 through the window layer 3 and is then absorbed by the absorption layer 7. Electrons and holes generated as a result of the light absorption are immediately swept by an electric field generated by a reverse bias applied to the photodiode, and are taken out as light signals. Since the band gap energy of Fe-doped InP, the material of the window layer 3, is larger than that of the InGaAs absorption layer 7, no light absorption occurs in the window layer 3.

In the photodiode according to this first embodiment, an interface between a window layer and the other semiconductor layers corresponds to an interface between the Fe-doped InP window layer 3 and the n-InP cladding layer 5. Therefore, the edge of the absorption layer 7 is free from contamination due to exterior environments and the like. Even when surface states are generated on the regrowth interface, these surface states do not increase dark current because the absorption layer 7 serving as a depletion region is not in contact with the regrowth interface.

Furthermore, the edge of the pn junction between the guide layers 6 and 8, through the absorption layer 7, is covered with the selective growth mask 4 comprising an insulating material, i.e., the pn junction is not exposed, so that the reliability of the photodiode is not reduced.

As described above, according to the first embodiment of the invention, after the window layer 3 is grown on the semiconductor substrate 1, the concavity 32 is produced by selectively etching the window layer 3 using the selective growth mask 4, and the n type lower cladding layer 5, the n type guide layer 6, the absorption layer 7, and the p type guide layer 8 are selectively grown in the concavity 32 using the selective growth mask 4. Therefore, an interface between the window layer 3 and the lower cladding layer 5 is a regrowth interface, so that the absorption layer 7 is not in contact with the regrowth interface, resulting in a photodiode with reduced dark current.

[Embodiment 2]

In a second embodiment of the invention, instead of covering the edge of the pn junction between the guide layers 6 and 8 with the insulating film 4 as described for the first embodiment, a high-resistance semiconductor layer 11 doped with a transition metal, such as Fe, is disposed on the edge of the pn junction as a protection layer.

FIGS. 4(a) to 4(d) are cross-sectional views illustrating process steps in a method of fabricating a photodiode according to a second embodiment of the invention. In these figures, the same reference numerals as those shown in FIGS. 2(a)–2(d) designate the same or corresponding parts. Reference numeral 11 designates an Fe-doped InP protection layer having a thickness of about 0.5 μm and a dopant (Fe) concentration of $4 \times 10^{16} cm^{-3}$.

A method of fabricating a photodiode according to this second embodiment will be described using FIGS. 4(a) to 4(d).

Initially, the same process steps as shown in FIGS. 1(a) and 1(b) according to the first embodiment are carried out.

Figure 4:
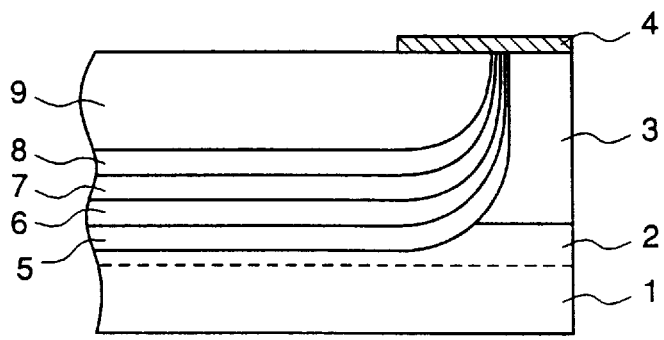
FIGS. 4(a) to 4(d) are cross-sectional views showing process steps in a method of fabricating a light detecting device according to a second embodiment of the invention.
Figure 4:
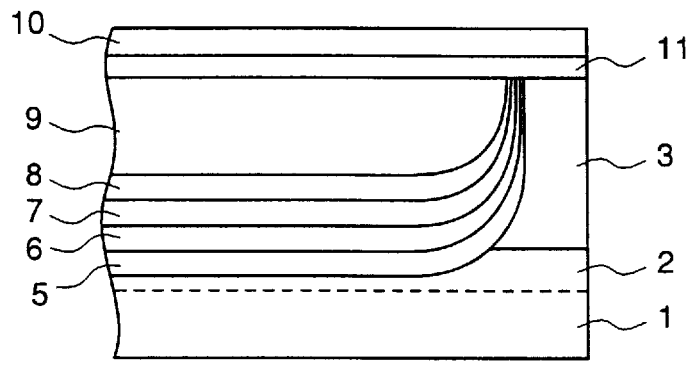
Figure 4:
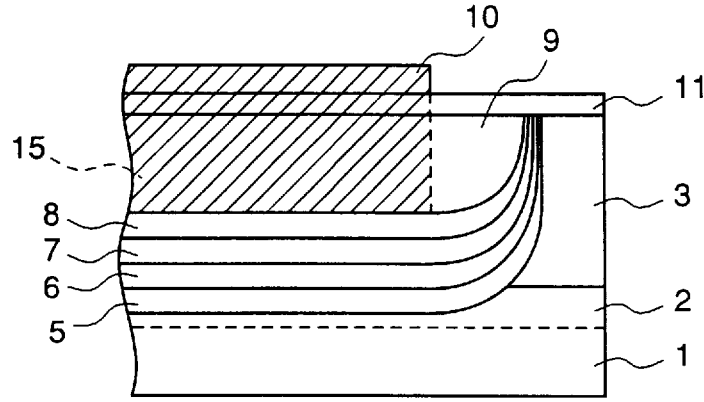
Figure 4:
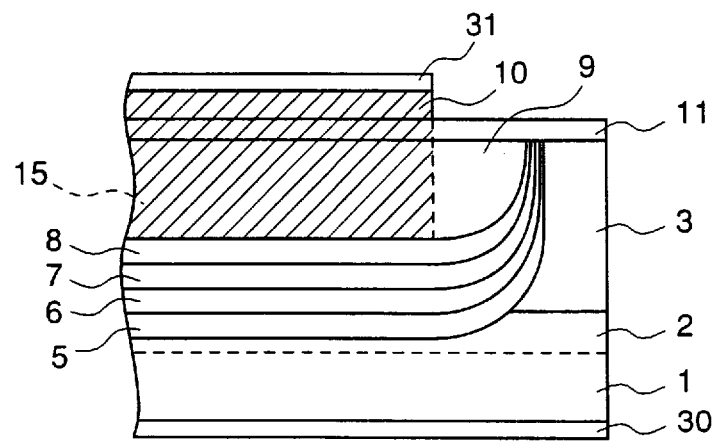

Thereafter, as shown in FIG. 4(a), the n-InP lower cladding layer 5, the n-InGaAsP guide layer 6, the InGaAs absorption layer 7, the p-InGaAsP guide layer 8, and the Fe-doped InP upper cladding layer 9 are successively grown in the concavity 32 by MOCVD using the selective growth mask 4.

In the step of FIG. 4(b), after removal of the mask 4, the Fe-doped InP protection layer 11 and the undoped InGaAs contact layer 10 having a thickness of 0.25 μm are successively grown on the entire surface of the substrate by MOCVD.

Further, although it is not shown in the figure, an insulating film comprising SiO$_2$ or the like and having an opening within a region where the upper cladding layer 9 is present, is formed on the contact layer 10. Thereafter, as shown in FIG. 4(c), Zn is diffused through the opening of the insulating film until it reaches an interface between the Fe-InP upper cladding layer 9 and the 1.4 μm wavelength p-InGaAsP guide layer 8, thereby forming a Zn diffused region 15. After removal of the insulating film, portions of the InGaAs contact layer 10 outside the Zn diffused region 15 are removed in a combination of photolithography and etching with a tartaric acid based etchant. The reason why the contact layer 10 is removed as mentioned above is to suppress light absorption in the contact layer 10 as much as possible because the contact layer 10 comprises InGaAs that absorbs light.

Finally, a p side electrode 31 is formed on the contact layer 10 and an n side electrode 30 is formed on the rear surface of the substrate 1, completing a photodiode as shown in FIG. 4(d).

In the photodiode according to the first embodiment, although the edge of the pn junction at the surface of the window layer 3 is covered with the selective growth mask 4, since the interface between the mask 4 and the edge of the pn junction is an interface between an insulating film and a semiconductor layer, the adhesion at the interface is unsatisfactory. So, surface states are likely to occur at the interface, and the device characteristics and reliability will be adversely affected by the surface states.

In this second embodiment, however, since the Fe-doped InP protection layer 11 is used instead of the SiO$_2$ selective growth mask 4, the interface between the edge of the pn junction and the protection layer 11 is improved in adhesion, whereby the device characteristics and reliability are improved. Since the protection layer 11 comprises a semiconductor material, Fe-doped InP, a new regrowth interface is produced between the protection layer 11 and each of the n-InGaAsP guide layer 6, the InGaAs absorption layer 7, and the p-InGaAsP guide layer 8. However, since the total thickness of the semiconductor layers grown on the side surfaces of the concavity 32 is significantly smaller than that of the semiconductor layers for absorbing light grown on the bottom of the concavity 32, the area of the regrowth interface is one tenth or less of the area of the regrowth interface in the conventional photodiode described above and, therefore, the increase in dark current is negligibly small.

Figure 10:
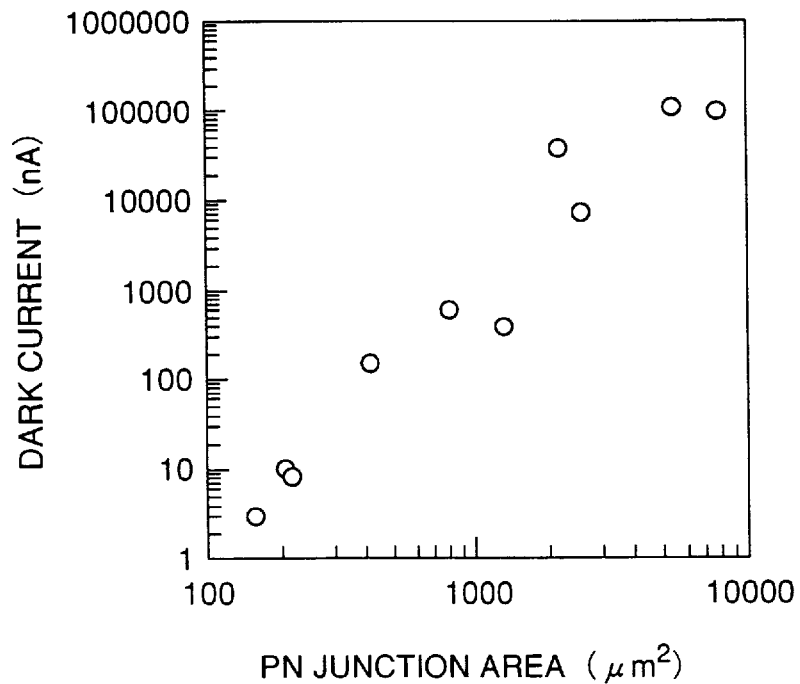
FIGS. 10(a) and 10(b) are diagrams for explaining the light detecting device according to the second embodiment.
Figure 10:
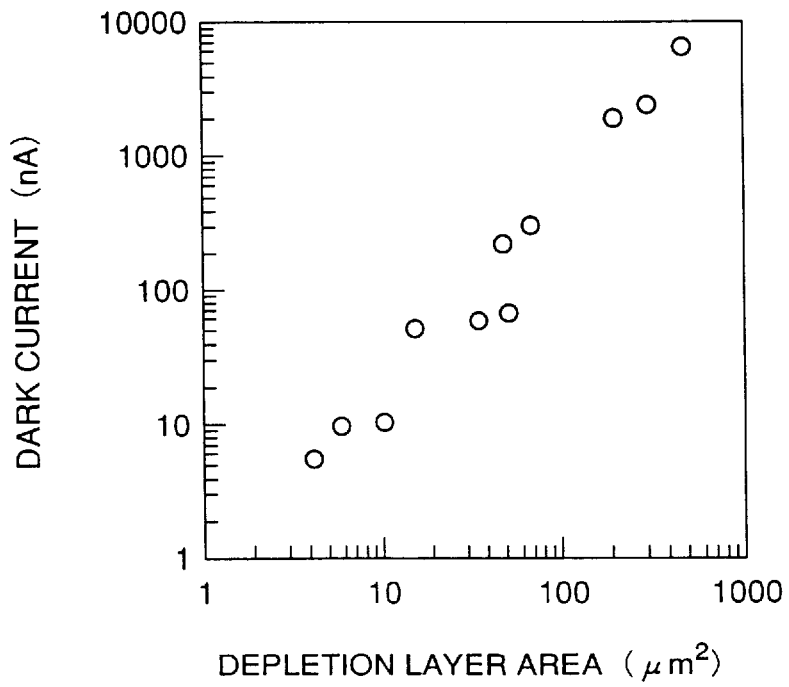

As shown in FIGS. 10(a) and 10(b), dark current in the photodiode has strong relationships with the area of the pn junction between the n type guide layer and the p type guide layer through the absorption layer and the area of the depletion layer contacting the regrowth interface, i.e., the area of the absorption layer. In the structure according to this second embodiment, for example, the area of the depletion layer contacting the regrowth interface is not more than 6 μm$^2$, so that the dark current does not exceed 10 nA. Dark current in the photodiode has a stronger relationship to one of the pn junction area and the depletion layer area than the other, depending on the structure of the photodiode, the quantity and kind of defects on the regrowth interface, and the like.

As described above, in the photodiode according to the second embodiment of the invention, since the absorption layer 7 does not contact the regrowth interface, the same effects as described in the first embodiment are achieved. Further, since Fe-doped InP is grown as the protection layer 11, the adhesion at the interface between the edge of the pn junction and the protection layer 11 is improved, resulting in improved characteristics and reliability of the photodiode.

[Embodiment 3]

Figure 5:
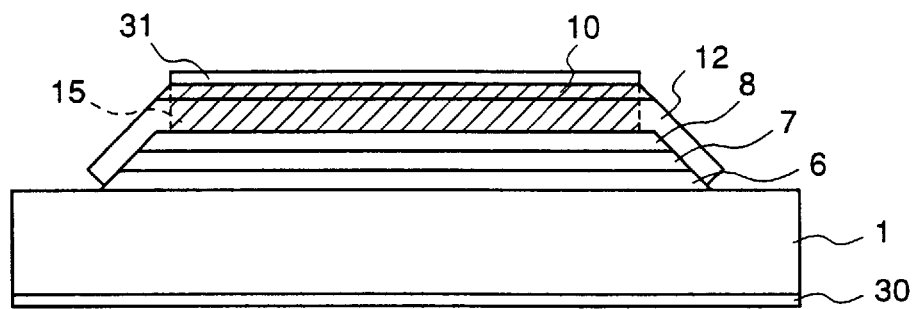
FIG. 5 is a cross-sectional view showing a structure of a light detecting device according to a third embodiment of the invention.

A structure of a photodiode according to a third embodiment is shown in FIG. 5. In this figure, the same reference numerals as in FIGS. 1(a) and 1(b) designate the same or corresponding parts. Reference numeral 12 designates an Fe-doped InP window layer having a thickness of approximately 2 μm and a dopant (Fe) concentration of $4 \times 10^{16} cm^{-3}$.

Figure 6:
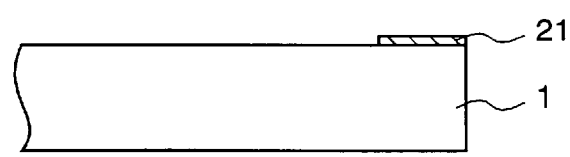
FIGS. 6(a) to 6(c) are cross-sectional views showing process steps in a method of fabricating a light detecting device according to the third embodiment.
Figure 6:
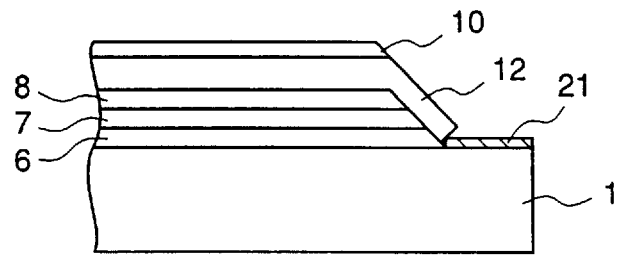
Figure 6:
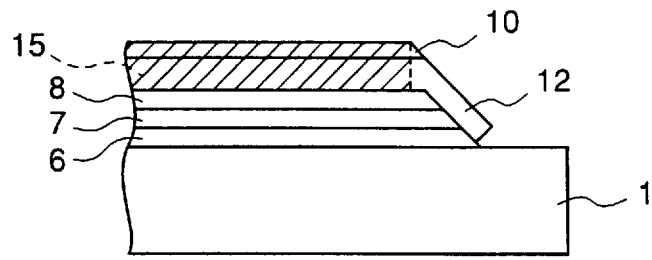

FIGS. 6(a) to 6(c) are cross-sectional views illustrating process steps in a method of fabricating the photodiode according to this third embodiment. In these figures, the same reference numerals as in FIG. 5 designate the same or corresponding parts. Reference numeral 21 designates a selective growth mask comprising an insulating film, such as an $SiO_2$ film, and having a rectangular opening. The longitudinal direction of the opening is [110] and the direction perpendicular to the longitudinal direction is [110].

First of all, as shown in FIG. 6(a), $SiO_2$ is deposited by sputtering over the (001) surface of the n-InP substrate (wafer) 1, and an opening is formed through the $SiO_2$ film by photolithography, providing an $SiO_2$ selective growth mask 21 approximately 100 μm thick. The shape of the mask 21 viewed from above is similar to that shown in FIG. 3. The opening is approximately 15 μm long in the [110] direction and approximately 5 μm wide in the [110] direction.

In the step of FIG. 6(b), the n-InGaAsP guide layer 6, the InGaAs absorption layer 7, the p-InGaAsP guide layer 8, the Fe-doped InP window layer 12, and the undoped InGaAs contact layer 10 are successively grown on the substrate 1 through the opening of the selective growth mask 21 by MOCVD. The n-InGaAsP guide layer 6, the InGaAs absorption layer 7, and the p-InGaAsP guide layer 8 have orientation dependencies in their growth rates. Therefore, at edges of these layers, i.e., in the vicinity of the mask 21, a specific crystal orientation, such as a (111)B plane, is formed, and the edges of the respective layers form a slope toward the substrate 1. On the other hand, since an InP layer doped with a transition metal, such as the Fe-doped InP window layer 12, has no orientation dependence in its growth rate, it grows so as to cover the entire surface of the underlying layer. To be specific, as shown in FIG. 6(b), the window layer 12 grows covering the upper surface of the p-InGaAsP guide layer 8 (i.e., a surface parallel to the surface of the substrate 1), and the slope comprising the edges of the p-InGaAsP guide layer 8, the InGaAs absorption layer 7 and the n-InGaAsP guide layer 6. If the contact layer 10 grows on a region outside a region opposite the p-InGaAsP guide layer 8, the contact layer 10 in this region is selectively removed by a tartaric acid based etchant.

In the step of FIG. 6(c), an insulating film (not shown) having an opening in a region opposite the contact layer 10 is formed over the entire surface of the substrate 1. Using the insulating film as a mask, Zn is diffused through the opening until it reaches an interface between the Fe-doped InP window layer 12 and the 1.4 μm wavelength p-InGaAsP guide layer 8, to form a p type diffused region 15. Thereafter, this insulating film and the selective growth mask 21 are removed. The window layer 12 in the diffused region 15 functions as a p type upper cladding layer.

Finally, a p side electrode 31 is formed on the surface of the contact layer 10 and an n side electrode 30 is formed on the rear surface of the substrate 1, completing the photodiode shown in FIG. 5.

In this photodiode, light enters parallel to the substrate 1. The light is transmitted through the sloped portion of the window layer 12 to reach the InGaAs absorption layer 7 and is absorbed by the absorption layer 7.

In this photodiode, since the absorption layer 7 and the window layer 12 are successively grown on the substrate 1, a regrowth interface due to regrowth of a window layer as in the conventional photodiode is not present. So, there is no possibility that the absorption layer 7 including a depletion layer, is in contact with a regrowth interface. This results in a reduction in dark current to 10 nA or less, which level does not adversely affect the practical use of the photodiode. Further, since the window layer 12 prevents the edge of the pn junction from being exposed, the reliability is not degraded.

Figure 13:
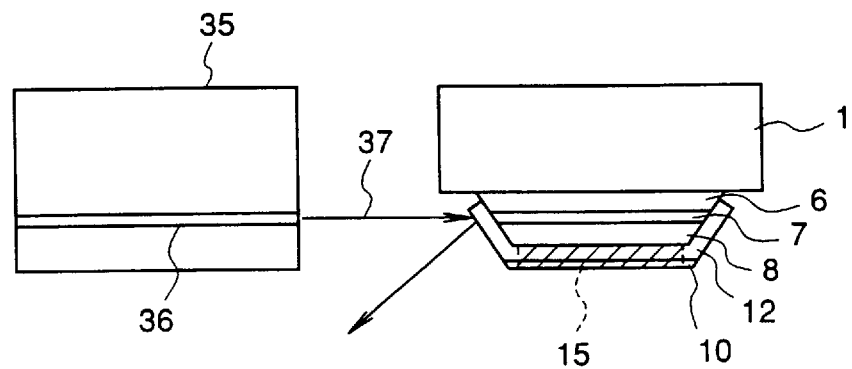
FIG. 13 is a diagram for explaining the light detecting device according to the third embodiment.
Figure 14:
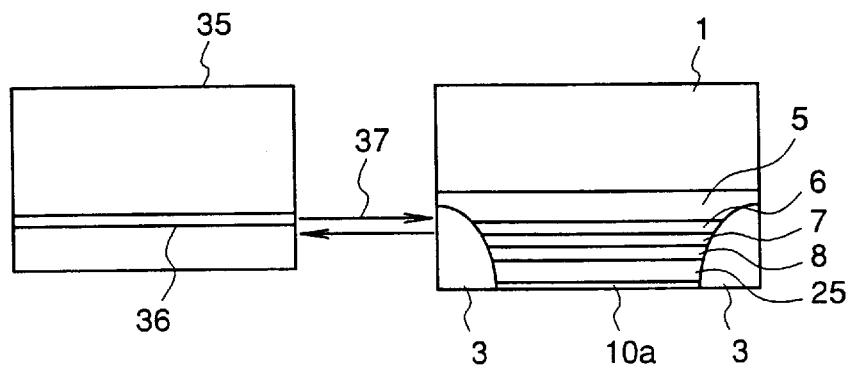
FIG. 14 is a diagram for explaining the conventional light detecting device.

FIG. 13 shows a system in which a photodiode according to this third embodiment is used as a monitor of a laser diode 35. FIG. 14 shows a system in which a conventional photodiode is used as a monitor of a laser diode 35. In these figures, the same reference numerals as those shown in FIGS. 5 and 11(a)–11(c) designate the same or corresponding parts. Reference numerals 36 and 37 designate an active layer and a laser beam, respectively.

When a photodiode according to the third embodiment is used for monitoring an output of a laser diode 35 as shown in FIG. 13, a laser beam 37 emitted from the laser diode 35 enters a light responsive surface of the photodiode in the vicinity of the edge of the absorption layer 7, but the light responsive surface reflects a part of the laser beam 37. As shown in FIG. 13, the reflected laser beam does not reenter the active layer 36 of the photodiode 35 because the light responsive surface slopes with respect to the growth direction of the absorption layer 7. Therefore, it is possible to monitor the output of the laser diode 35 while maintaining stable operation of the laser diode 35. Although a case of employing a laser diode has been discussed, the same effects are also obtained in a system employing a device that will be adversely affected by reentrance of reflected light.

Figure 11:
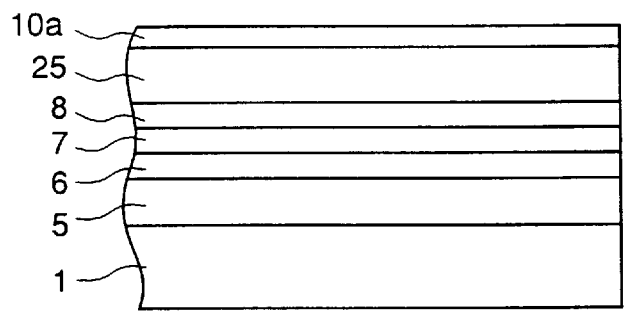
FIGS. 11(a) to 11(c) are cross-sectional views showing process steps in the conventional method of fabricating a light detecting device.
Figure 11:
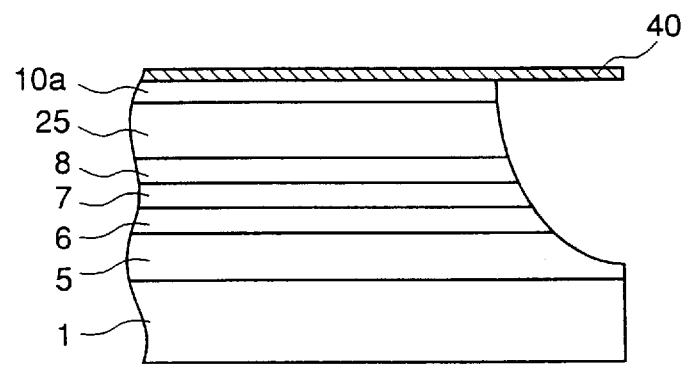
Figure 11:
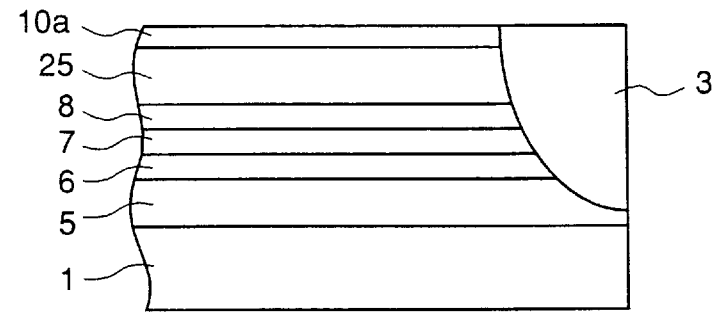
Figure 12:
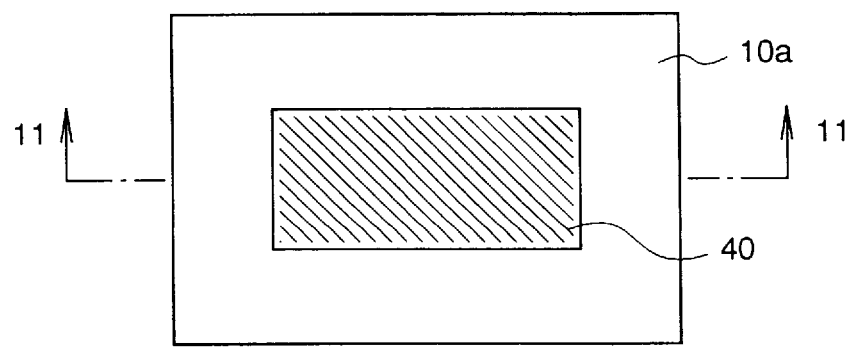
FIG. 12 is a plan view showing a main step of the conventional fabrication method.

On the other hand, as shown in FIG. 11(c), a light responsive surface of the conventional photodiode is perpendicular to the growth direction of the absorption layer 7. So, when a laser beam 37 emitted from the laser diode 35 is reflected at the light responsive surface, the reflected beam reenters the active layer 36 of the laser diode 35, as shown in FIG. 14. Particularly, when the light beam from the laser diode 35 has been modulated at a high speed, a time-delayed beam will enter the active layer 36, resulting in unstable operation of the laser diode 35.

As described above, according to the third embodiment of the present invention, since the guide layer 6, the absorption layer 7, the guide layer 8, the Fe-doped InP window layer 12, and the contact layer 10 are successively grown using the selective growth mask 21, no regrowth interface is produced, resulting in reduced dark current.

Figure 7:
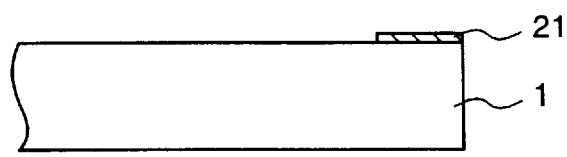
FIGS. 7(a) to 7(c) are cross-sectional views showing process steps in a method of fabricating a light detecting device according to a modification of the third embodiment.
Figure 7:
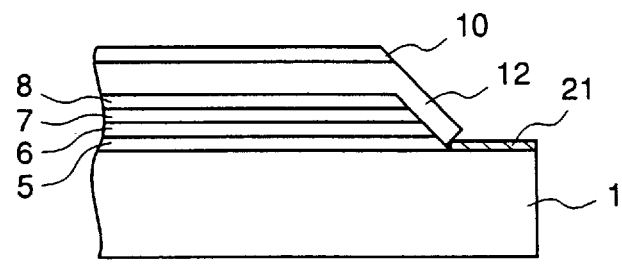
Figure 7:
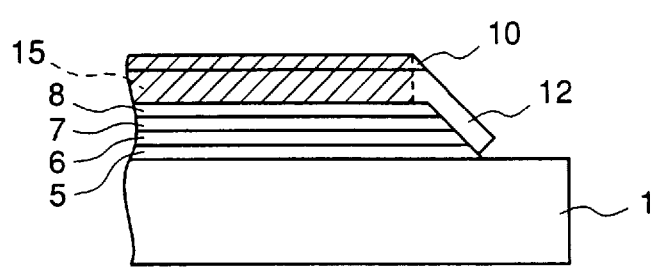

A method of fabricating a photodiode according to a modification of the third embodiment is shown in FIGS. 7(a) to 7(c), wherein the same reference numerals as in FIGS. 1(a)–1(b) and 6(a)–6(c) designate the same or corresponding parts. In this modification, an n-InP cladding layer 5 is selectively grown as a first layer before growth of the n type guide layer 6, and the edge of the InGaAsP guide layer 6 is completely covered by the window layer 12, thereby preventing generation of surface states on the edge of the guide layer 6. As a result, deterioration of the photodiode is avoided.

[Embodiment 4]

A photodiode according to a fourth embodiment of the invention is different from the photodiode according to the third embodiment only in that an Fe-doped InP protection film 13 comprising a material that does not absorb light is inserted between the window layer 12 and the contact layer 10, covering the entire surface of the substrate, and an end facet of the protection film 13 from which light enters, is perpendicular to the substrate 1.

FIGS. 8(a)–8(d) are cross-sectional views illustrating process steps in a method of fabricating a photodiode according to a fourth embodiment of the present invention. In these figures, the same reference numerals as those shown in FIGS. 6(a)–6(c) designate the same or corresponding parts. Reference numeral 13 designates an Fe-doped protection layer having a thickness of about 2 μm and a dopant (Fe) concentration of $4 \times 10^{16} cm^{-3}$.

A description is given of the fabrication method.

Figure 8:
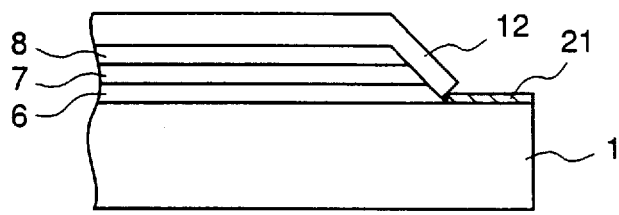
FIGS. 8(a) to 8(d) are cross-sectional views showing process steps in a method of fabricating a light detecting device according to a fourth embodiment of the invention.
Figure 8:
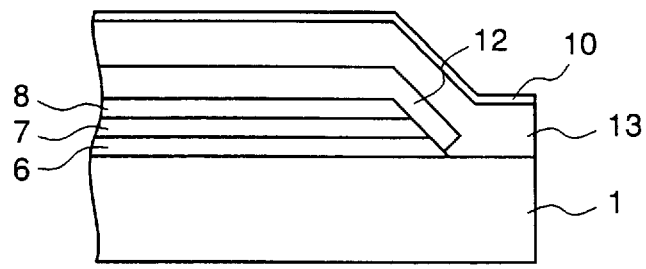
Figure 8:
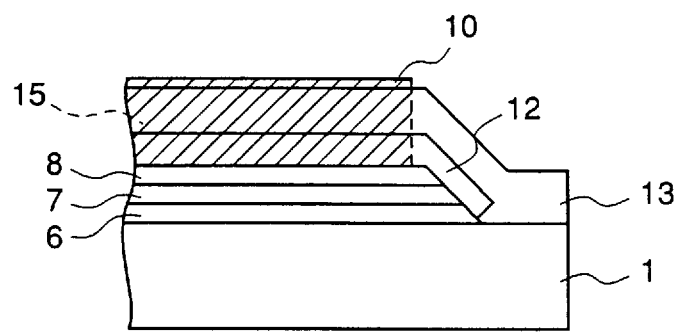
Figure 8:
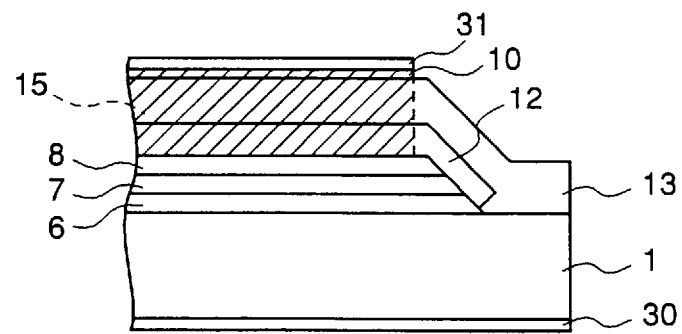

After formation of the SiO$_2$ selective growth mask 21 on the substrate 1 as shown in FIG. 6(a), the n-InGaAsP guide layer 6, the InGaAs absorption layer 7, the p-InGaAsP guide layer 8, and the Fe-doped InP window layer 12 are successively grown by MOCVD as shown in FIG. 8(a).

In the step of FIG. 8(b), after removal of the selective growth mask 21, the Fe-doped InP protection layer 13 and the InGaAs contact layer 10 are successively grown by MOCVD. To reduce light absorption by the contact layer 10, the contact layer 10 is selectively removed with a tartaric acid based etchant, using a resist mask or the like, leaving a portion in a region opposite the p-InGaAsP guide layer 8 excluding its sloping edges. Thereafter, an insulating film (not shown) having an opening opposite the contact layer 10 is formed. Using this film as a mask, Zn is diffused through the opening until Zn reaches an interface between the Fe-doped InP window layer 12 and the p-InGaAsP guide layer 8, thereby forming a Zn diffused region 15 of p type.

In the step of FIG. 8(c), after removal of the insulating film, a facet perpendicular to the surface of the substrate 1 is formed by dry-etching or cleavage of the protection layer 13 in a position opposed to the sloping edge of the absorption layer 7, a light responsive part.

Finally, a p side electrode 31 is formed on the upper surface of the contact layer 10, and an n side electrode 30 is formed on the rear surface of the substrate 1, completing a photodiode as shown in FIG. 8(d).

In the photodiode according to the third embodiment, since the sloping edge of the window layer 12 serving as a light responsive part is not perpendicular to the growth surface of the absorption layer 7, a light beam traveling toward the photodiode parallel to the substrate 1 is not completely received by the absorption layer 7 in the photodiode because a portion of the light beam is reflected at the sloping edge of the window layer 12 before reaching the absorption layer 7, resulting in insufficient optical coupling.

On the other hand, in the photodiode according to this fourth embodiment, the protection layer 13 transparent to light is disposed over the entire surface of the substrate, and the end facet of the protection layer 13 is perpendicular to the absorption layer 7. Therefore, a light beam incident on the facet of protection layer 13 parallel to the substrate 1 reaches the absorption layer 7 without being reflected at the facet of the protection layer 13, resulting in sufficient optical coupling.

As described above, according to the fourth embodiment of the invention, the Fe-doped InP protection layer 13 is inserted between the window layer 12 and the contact layer 10, covering the entire surface of the substrate, and an end facet of the protection film 13 from which light enters, is perpendicular to the substrate 1. Therefore, incident light is not reflected at the facet of the protection film 13, resulting in a photodiode with high optical coupling efficiency.

[Embodiment 5]

FIGS. 9(a) to 9(d) are cross-sectional views illustrating process steps in a method of fabricating a photodiode according to a fifth embodiment of the invention. In these figures, the same reference numerals as in FIG. 5 designate the same or corresponding parts, and reference numerals 1a and 1b designate an upper stage and a step-shaped portion (hereinafter referred to simply as a step), respectively.

A description is given of the fabrication method.

Figure 9:
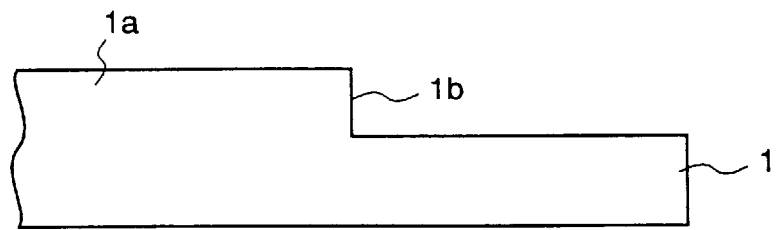
FIGS. 9(a) to 9(d) are cross-sectional views showing process steps in a method of fabricating a light detecting device according to a fifth embodiment of the invention.
Figure 9:
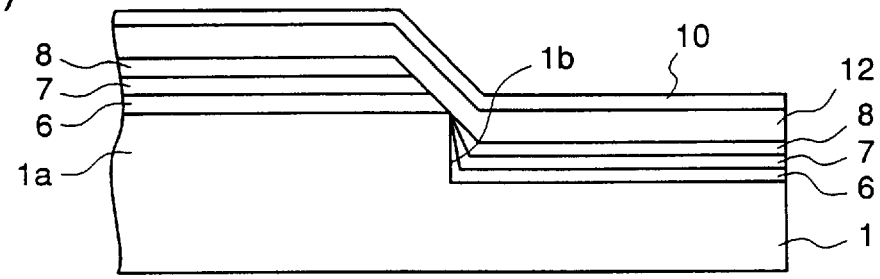
Figure 9:
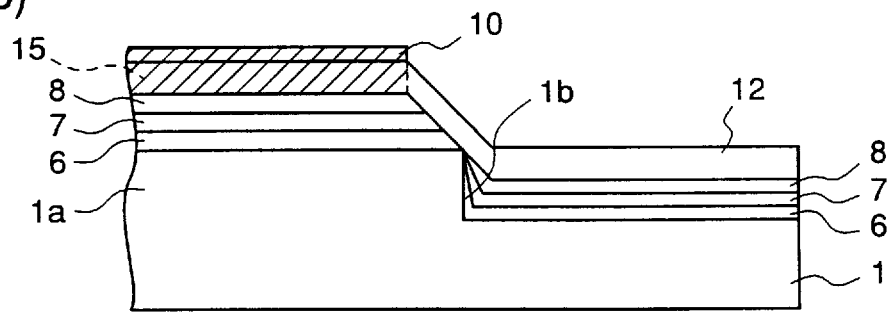
Figure 9:
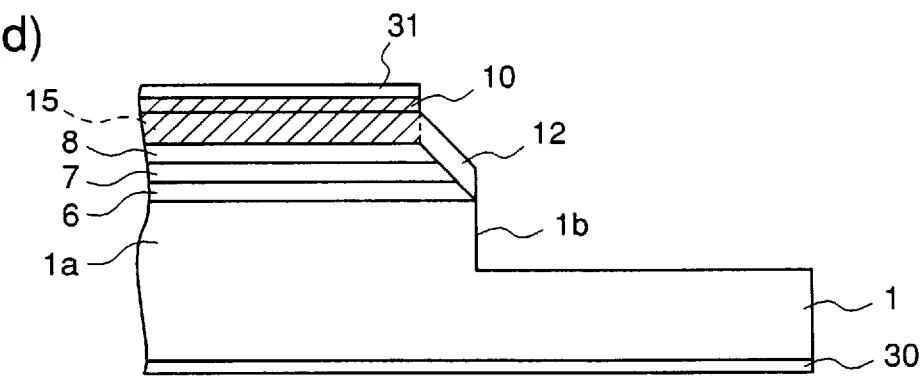

Initially, as shown in FIG. 9(a), a predetermined area on the (001) surface of the n-InP substrate (wafer) 1 is etched to a predetermined depth, for example, approximately 5 μm, utilizing photolithography and dry etching, to form a step 1b in the [110] orientation in the substrate 1. The area not etched is an upper stage 1a protruding upward from the surface of the etched area. The plane shape of the upper stage 1a is a rectangle having a width of about 5 μm and a length of about 15 μm, and its orientation is [110] in the longitudinal direction and [110] in the width direction perpendicular to the longitudinal direction.

In the step of FIG. 9(b), the n-InGaAsP guide layer 6, the InGaAs absorption layer 7, the p-InGaAsP guide layer 8, the Fe-doped InP window layer 12, and the 0.25 μm thick undoped InGaAs contact layer 10 are successively grown by MOCVD. The guide layer 6, the absorption layer 7, and the guide layer 8 have orientation dependencies in their growth rates, so that these layers slope to the step 1b in a region including the edge of the upper stage 1a, i.e., the step 1b. As a result, the layers grown on the upper stage 1a and those on the other area are separated by the step 1b, and the edges of these layers on the upper stage 1a in the vicinity of the step 1a form a sloped surface having a specific crystal orientation, for example, a (111)B plane.

On the other hand, since the Fe-doped InP window layer 12 has no orientation dependence in its growth rate, it grows covering the entire surface of the substrate, as shown in FIG. 9(b). Specifically, on the upper stage 1a, the window layer 12 grows covering the upper surface of the p-InGaAsP guide layer 8 and the sloped edges of the guide layer 8, the absorption layer 7 and the guide layer 6.

In the step of FIG. 9(c), within a region of the upper stage 1a opposite the p type guide layer 8, Zn is diffused from the surface of the contact layer 10 so that it reaches an interface between the Fe-doped InP window layer 12 and the p-InGaAsP guide layer 8, thereby forming a Zn diffused region 15 of p type. Then, the InGaAs contact layer 10 outside the Zn diffused region 15 is selectively removed.

Finally, the semiconductor layers on a region other than the upper stage 1a of the substrate 1 are removed by dry etching using a resist mask or the like. A p side electrode 31 is formed on the top surface of the contact layer 10 and an n side electrode 30 is formed on the rear surface of the substrate 1, completing a photodiode as shown in FIG. 9(d).

In the photodiode so fabricated, no regrowth interface is present because the respective layers including the absorption layer 7 and the window layer 12 are successively grown on the substrate 1. That is, there is no possibility that the absorption layer 7 including a depletion layer, is in contact with a regrowth interface, whereby dark current is reduced to 10 nA or less, which level does not adversely affect the practical use of the photodiode. Further, since the window layer 12 prevents the edge of the pn junction from being exposed, the reliability of the photodiode is not degraded.

As described above, according to the fifth embodiment of the invention, the n type guide layer 6, the absorption layer 7, the p type guide layer 8, the Fe-doped InP window layer 12, and the contact layer 10 are successively grown over the substrate 1 having the upper stage 1a whose edge is the step 1b and, thereafter, these semiconductor layers on a region outside the upper stage 1a are selectively removed. In a photodiode so fabricated, no regrowth interface is present, resulting in a reduction in dark current.

Although InP based materials are employed in the first to fifth embodiments, this invention is applicable to a case employing other semiconductor materials, such as GaAs based materials, with the same effects as provided by the first to fifth embodiments.

Although an n type substrate is employed in the first to fifth embodiments, this invention is applicable to a case employing a p type substrate with the same effects as provided by the first to fifth embodiments.

Although a photodiode is exemplified in the first to fifth embodiments, this invention is applicable to other light detecting devices with the same effects as provided by the first to fifth embodiments.

What is claimed is:

1. A light detecting device comprising:
   a first conductivity type semiconductor substrate;
   a window layer disposed on the substrate and comprising an insulating semiconductor layer having a surface, a thickness, and a band gap energy;
   a concavity in a region of the window layer and having a depth larger than the thickness of the window layer;
   successively disposed on bottom and side surfaces of the concavity in the window layer, a first conductivity type lower cladding layer comprising a semiconductor material having a band gap energy, a first conductivity type guide layer comprising a semiconductor material having a composition and a band gap energy smaller than the band gap energies of the lower cladding layer and the window layer, an undoped light absorption layer comprising a semiconductor material having a band gap energy smaller than the band gap energy of the first conductivity type guide layer, a second conductivity type guide layer comprising a semiconductor material having a composition approximately identical to the composition of the first conductivity type guide layer, edges of the first conductivity type guide layer, the light absorption layer, and the second conductivity type guide layer being exposed at the surface; and
   a layer of an insulating material, disposed on the surface covering the edges.

2. The light detecting device of claim 1 wherein the layer of an insulating material is an insulating semiconductor layer.

3. A light detecting device comprising:
   a first conductivity type semiconductor substrate having a planar surface;
   successively disposed on an area of the surface of the substrate and having edges that slope toward the substrate, a first conductivity type guide layer comprising a semiconductor material having a composition and a band gap energy, an undoped light absorption layer comprising a semiconductor material having a band gap energy smaller than the band gap energy of the first conductivity type guide layer, and a second conductivity type guide layer comprising a semiconductor material having a composition approximately identical to the composition of the first conductivity type guide layer;
   a window layer comprising an insulating semiconductor layer including a transition metal and having a band gap energy larger than the band gap energy of the first conductivity type guide layer, disposed on the second conductivity type guide layer and on the edges of the second conductivity type guide layer that slope toward the substrate, the light absorption layer, and the first conductivity type guide layer; and
   a region containing a dopant impurity producing the second conductivity type, disposed in a region of the window layer opposite the second conductivity type guide layer.

4. The light detecting device of claim 3 further comprising:
   a protection layer, comprising the same material as the window layer, disposed on the window layer and on a region of the substrate where the semiconductor layers are not present, the protection layer having a facet perpendicular to the planar surface of the light absorption layer; and
   a region containing a dopant impurity producing the second conductivity type, disposed in a region of the protection layer opposite the second conductivity type guide layer.

5. A light detecting device comprising:
   a first conductivity type semiconductor substrate having an upper stage, and a step at an edge of the upper stage;
   successively disposed on the upper stage of the substrate and having edges sloping toward the substrate in the vicinity of an edge of the upper stage, a first conductivity type guide layer comprising a semiconductor material having a composition and a band gap energy, an undoped light absorption layer comprising a semiconductor material having a band gap energy smaller than the band gap energy of the first conductivity type guide layer, and a second conductivity type guide layer comprising a semiconductor material having a composition approximately identical to that of the first conductivity type guide layer;
   a window layer comprising an insulating semiconductor layer including a transition metal and having a band gap energy larger than the band gap energy of the first conductivity type guide layer, the window layer being on the second conductivity type guide layer and on the edges of the second conductivity type guide layer sloping toward the substrate, the light absorption layer, and the first conductivity type guide layer; and
   a region containing a dopant impurity producing the second conductivity type, disposed in a region of the window layer opposite the second conductivity type guide layer.

* * * * *